United States Patent

Hussmann et al.

[11] Patent Number: 6,128,189
[45] Date of Patent: Oct. 3, 2000

[54] DEVICE FOR WITHDRAWAL OF THERMAL POWER LOSS OF ELECTRONIC OR ELECTRICAL COMPONENTS

[75] Inventors: Dieter Hussmann, Steinheim; Peter Jares, Sindelfingen; Thomas Jessberger, Rutesheim; Didier Weber, Vaihingen, all of Germany

[73] Assignee: Robert Bosch GmbH, Stuttgart, Germany

[21] Appl. No.: 08/591,661

[22] PCT Filed: May 12, 1995

[86] PCT No.: PCT/DE95/00632

§ 371 Date: Jan. 30, 1996

§ 102(e) Date: Jan. 30, 1996

[87] PCT Pub. No.: WO96/08129

PCT Pub. Date: Mar. 14, 1996

[30] Foreign Application Priority Data

Sep. 9, 1994 [DE] Germany ............................ P44 32 057

[51] Int. Cl.[7] ............................................. H05K 7/20
[52] U.S. Cl. ............................................. 361/704; 361/719
[58] Field of Search ................................. 257/712, 713, 257/727, 730, 731; 165/80.2, 80.3, 185; 174/16.3, 252, 35 R; 361/699, 702, 704–707, 714–719, 736, 752, 816, 818

[56] References Cited

U.S. PATENT DOCUMENTS

| | | | |
|---|---|---|---|
| 4,115,836 | 9/1978 | Hutchison | 361/382 |
| 4,259,685 | 3/1981 | Romano | 357/81 |
| 4,339,260 | 7/1982 | Johnson | 65/160 |
| 4,475,145 | 10/1984 | Heil | 361/386 |
| 4,811,165 | 3/1989 | Currver | 361/386 |
| 5,201,866 | 4/1993 | Mok | 165/80.3 |
| 5,418,685 | 5/1995 | Hussmann | 361/719 |

FOREIGN PATENT DOCUMENTS

| | | |
|---|---|---|
| 0338447 | 10/1989 | European Pat. Off. . |
| 7505294 | 7/1975 | Germany . |
| 93-06705 | 4/1993 | WIPO . |

*Primary Examiner*—Gerald Tolin
*Attorney, Agent, or Firm*—Michael J. Striker

[57] ABSTRACT

A device for dissipation of the thermal power loss of an electronic or electromechanical component (10) is proposed, in which an adequate cooling surface area is available. To obtain the largest possible cooling surface area at low assembly outlay, the components (1) have a heat-conducting connection with a metal-coated surface of a printed circuit board (2). The coated surface parts (5, 7) protrude as far as a connecting segment (10; 10a, 10b, 10c) of a housing (8, 9) that entirely or partially surrounds the printed circuit board (2). At least one connecting segment (10, 10a, 10b, 10c) of the housing (8, 9) is embodied in crowned fashion on its surface such, that upon fastening of the housing (8, 9) to the printed circuit board (2), a durable contact pressure between the housing (8, 9) and the printed circuit board (2) is exerted by the deformation of the crowned surface.

7 Claims, 1 Drawing Sheet

DEVICE FOR WITHDRAWAL OF THERMAL POWER LOSS OF ELECTRONIC OR ELECTRICAL COMPONENTS

BACKGROUND OF THE INVENTION

The invention relates to a device for dissipation of the thermal power loss of an electronic or electromechanical component as generically defined by the preamble to the main claim. Such devices, in which individual power components are joined to heat sinks especially provided for them are already known. For example, the power components are pressed against the heat sinks via retention springs in order to assure an adequate contact pressure. However, this requires special retaining and cooling components and separation production steps in assembly.

SUMMARY OF THE INVENTION

Accordingly, it is an object of the present invention to provide a device for withdrawal of thermal power loss of electrical or electrical components, which avoids the disadvantages of the prior art.

In keeping with these objects and with others which will become apparent hereinafter, one feature of the present invention resides, briefly stated, in the device of the above mentioned general type in which the components have a heat-conducting connection with a metal-coated surface of a printed circuit board, and the coated surface portions protrude as far as the inside of at least one connecting segment of a housing that entirely or partially surrounds the printed circuit board, and that the at least one connecting segment of the housing is located facing the printed circuit board and is embodied in crowned fashion on its surface in such a way that a durable contact pressure is exerted between the housing and the printed circuit board as a result of the deformation of the crowned surface.

When the device is designed in accordance with the present invention, it is advantageous in that, in a simple way the housing takes on the function of the heat sink, and the requisite contact pressure for the dissipation of the heat loss is produced in conjunction with the assembly of the housing. No special retaining elements are needed. All the power components present on the printed circuit board are cooled in the manner according to the invention via the housing. When the housing is assembled, the particular contact pressure required can be produced by the choice of the type of fastening and by means of a suitable assembly process.

In addition, by means of a suitable embodiment of the copper layers in accordance with dependent claim 4, an increase in the effective surface area of both the copper layers on the printed circuit board and an improved dissipation of the heat loss at the connecting segments can be attained. The soldered connection between the two surfaces can easily be made during the solder immersion bath of the printed circuit board.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
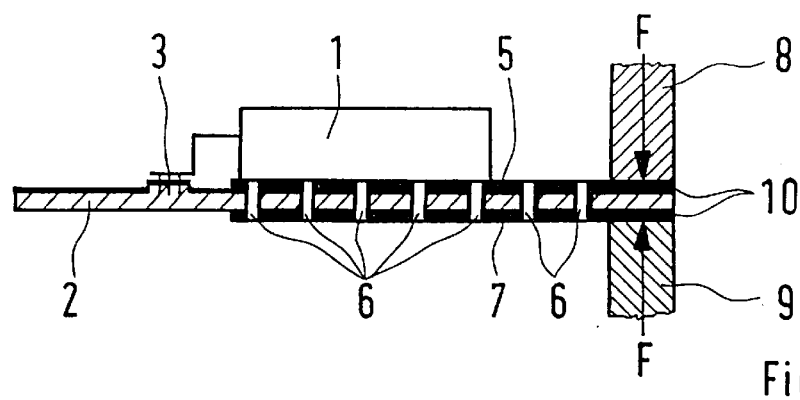
FIG. 1, a section through a fastening of a power component on a printed circuit board.

In FIG. 1, a power component 1, for instance a power transistor, is secured to a printed circuit board 2. The electrical connections are made via soldered terminals 3, and a connection for carrying the lost heat onward is assured via an integrated metal plate that is permanently connected to a copper layer 5. The permanent connection can be made by soldering or for example by adhesive bonding, using a heat-conductive adhesive. The upper copper layer 5 is joined to a lower copper layer 7 via feed-through solder tags 6.

Portions of an upper housing part 8 and a lower housing part 9 which are hat or crown shaped can be seen on the right-hand end of the printed circuit board 2; connecting segments or flanges 10 are formed both on the on the upper side of the printed circuit board 2 and on the lower side of the printed circuit board 2. These connecting segments 10 are shown only schematically here; the special shaping of the surface and the fastening devices also necessary will be described in conjunction with the subsequent drawing figures. Heat dissipation is effected in the exemplary embodiment of FIG. 1 from the power component 1 via the copper layers 5 and 7 to the housing parts 8 and 9. To assure good heat dissipation to the housing, a durable contact pressure F from the housing parts 8 and 9 onto the copper layers 5 and 7 of the printed circuit board 2 is necessary.

Figure 2:
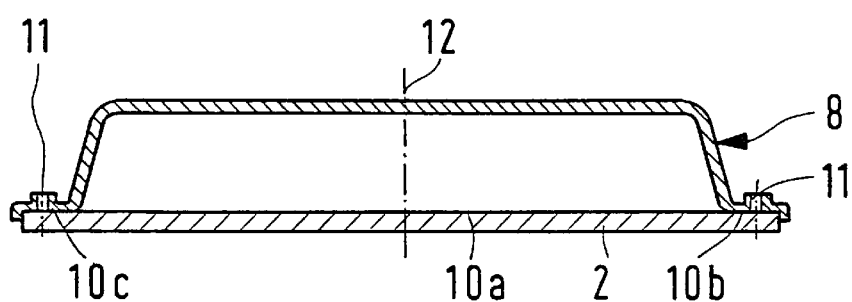
FIG. 2, a section through an upper housing part in the form of a covering of the printed circuit board.

In FIG. 2, a section through the upper housing part 8 is shown which, after the production of the printed circuit board 2, is secured thereto. In this view, two fastening holes 11 can be seen on the sides; they serve by way of example to receive a screw connection. In the same way, a lower housing part (not shown here) can be attained; it can be jointly retained by the upper housing part 8 by means of a suitable interengagement, for example. On the sides of the housing parts 8 and 9 toward the printed circuit board 2, the connecting segments 10a, 10b and 10c are formed, which connecting segments have a crowned surface shape, or in other words are formed like a crown. In the unmounted state the connecting segment 10a, for instance, has an elevation of approximately 0.2 to 0.4 mm beyond the corner regions at the level of the center axis 12 of the housing part 8. The connecting segments 10b and 10c here extend at right angles to the connecting segment 10a and are embodied in crowned fashion in a comparable way.

Figure 3:
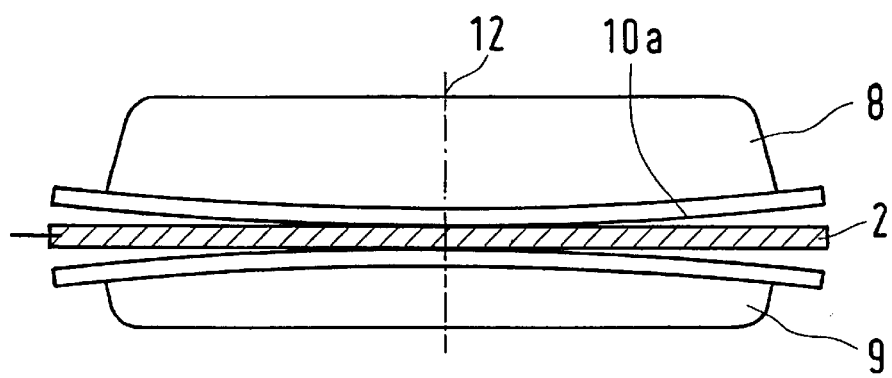
FIGS. 3 and 4, a section through a schematic, enlarged detail of a connecting segment between the housing and the printed circuit board, before and after the assembly of the housing.
Figure 4:
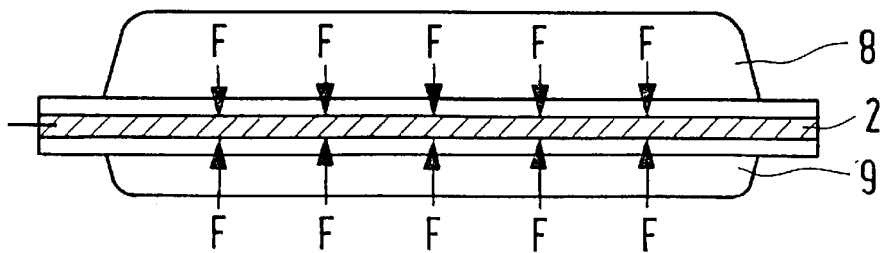

Since the crowned embodiment of the connecting segments 10a, 10b and 10c cannot be seen in FIG. 2, which is accurately to scale, this feature is illustrated enlarged and not to scale in FIGS. 3 and 4. In FIG. 3, the housing parts 8 and 9 are shown with the connecting segments 10a prior to assembly with the printed circuit board 2. The crowned embodiment of the connecting segment 10a at the level of the center axis 12 is clearly apparent here. After assembly (FIG. 4), the connecting segment 10a closely conforms to the surface of the printed circuit board 2; the contact pressure, effected permanently via the fastening device, not shown here, produces forces F that assure excellent contact between the printed circuit board 2 and the housing parts 8 and 9 for optimal heat dissipation.

What is claimed is:

1. A device for dissipation of thermal power loss of an electronic or electromechanical component, comprising a printed circuit board having a metal-coated surface with coated surface portions; a housing having two halves surrounding said printed circuit board, each said housing half having a hat or crown shape with an enclosure section and a flange or connection section, said coated surface portions being aligned with portions of said connecting segments, said connecting segments facing said printed circuit board and having convex surfaces which are deformed and provide a durable contact pressure between said housing and said printed circuit board with said housing halves fastened to said printed circuit board.

2. A device as defined in claim 1, wherein said housing entirely surrounds said printed circuit board.

3. A device as defined in claim 1, wherein said housing partially surrounds said printed circuit board.

4. A device as defined in claim 1, wherein said housing is a metal part.

5. A device as defined in claim 1, wherein each of said connecting segments has a deviation from a plane within a range from 0.2 mm to 0.6 mm.

6. A device as defined in claim 1, wherein said housing entirely surrounds said printed circuit board on at least one side; and further comprising screw connections which secure said housing to said printed circuit board at four corners.

7. A device as defined in claim 1, wherein said coated surface portions are provided with heat-dissipating layers arranged on both sides of said printed circuit board and joined together via feed-through solder tags in said printed circuit board.

* * * * *